(12) United States Patent
Annapragada et al.

(10) Patent No.: US 7,534,363 B2
(45) Date of Patent: May 19, 2009

(54) METHOD FOR PROVIDING UNIFORM REMOVAL OF ORGANIC MATERIAL

(75) Inventors: Rao V. Annapragada, Union City, CA (US); Odette Turmel, Fremont, CA (US); Kenji Takeshita, Fremont, CA (US); Lily Zheng, Fremont, CA (US); Thomas S. Choi, San Jose, CA (US); David R. Pirkle, Soquel, CA (US)

(73) Assignee: Lam Research Corporation, Fremont, CA (US)

( * ) Notice: Subject to any disclaimer, the term of this patent is extended or adjusted under 35 U.S.C. 154(b) by 232 days.

(21) Appl. No.: 10/877,222

(22) Filed: Jun. 25, 2004

(65) Prior Publication Data

US 2005/0006346 A1    Jan. 13, 2005

Related U.S. Application Data

(63) Continuation-in-part of application No. 10/642,083, filed on Aug. 14, 2003, now Pat. No. 7,371,332, which is a continuation-in-part of application No. 10/318,612, filed on Dec. 13, 2002, now Pat. No. 7,169,231.

(51) Int. Cl.
    *C23F 1/00* (2006.01)
(52) U.S. Cl. .................. 216/67; 257/E21.252
(58) Field of Classification Search .......... None
    See application file for complete search history.

(56) References Cited

U.S. PATENT DOCUMENTS

| | | | |
|---|---|---|---|
| 4,275,752 A | 6/1981 | Collier et al. | |
| 4,369,031 A | 1/1983 | Goldman et al. | |
| 4,812,201 A | 3/1989 | Sakai et al. | |
| 4,835,114 A | 5/1989 | Satou et al. | |
| 4,980,204 A | 12/1990 | Fujii et al. | 117/98 |
| 5,013,398 A | 5/1991 | Long et al. | 156/643 |
| 5,077,875 A | 1/1992 | Hoke et al. | |
| 5,134,965 A | 8/1992 | Tokuda et al. | 118/723 |
| 5,200,388 A | 4/1993 | Abe et al. | |

(Continued)

FOREIGN PATENT DOCUMENTS

EP    0 291 181 A2    11/1988

(Continued)

OTHER PUBLICATIONS

International Search Report, date of mailing Sep. 1, 2004.

(Continued)

*Primary Examiner*—Allan Olsen
(74) *Attorney, Agent, or Firm*—Beyer Law Group LLP

(57) ABSTRACT

A method for removing organic material over a substrate is provided. The substrate is placed in a plasma processing chamber. A first gas is provided to an inner zone within the plasma processing chamber. A second gas is provided to an outer zone of the plasma processing chamber, wherein the outer zone surrounds the inner zone and the second gas has a carbon containing component, wherein a concentration of the carbon containing component of the second gas is greater than a concentration of the carbon containing component in the first gas. Plasmas are simultaneously generated from the first gas and second gas. Some or all of the organic material is removed using the generated plasmas.

13 Claims, 8 Drawing Sheets

U.S. PATENT DOCUMENTS

| | | | |
|---|---|---|---|
| 5,288,325 A | 2/1994 | Gomi | |
| 5,310,426 A | 5/1994 | Mori | |
| 5,313,982 A | 5/1994 | Ohmi et al. | |
| 5,356,515 A | 10/1994 | Tahara et al. | |
| 5,415,728 A | 5/1995 | Hasegawa et al. | 156/643.1 |
| 5,431,738 A | 7/1995 | Murakami et al. | 118/720 |
| 5,453,124 A | 9/1995 | Moslehi et al. | |
| 5,455,070 A | 10/1995 | Anderson et al. | |
| 5,460,654 A | 10/1995 | Kikkawa et al. | |
| 5,496,408 A | 3/1996 | Motoda et al. | 118/715 |
| 5,522,934 A | 6/1996 | Suzuki et al. | 118/723 |
| 5,532,190 A | 7/1996 | Goodyear et al. | 438/710 |
| 5,589,110 A | 12/1996 | Motoda et al. | |
| 5,614,055 A | 3/1997 | Fairbairn et al. | 156/345 |
| 5,620,524 A | 4/1997 | Fan et al. | |
| 5,651,825 A | 7/1997 | Nakahigashi et al. | |
| 5,702,530 A | 12/1997 | Shan et al. | 118/723 MP |
| 5,736,457 A | 4/1998 | Zhao | 438/624 |
| 5,744,049 A | 4/1998 | Hills et al. | |
| 5,772,771 A | 6/1998 | Li et al. | 118/723 I |
| 5,853,484 A | 12/1998 | Jeong | 118/715 |
| 5,865,205 A | 2/1999 | Wilmer | |
| 5,916,369 A | 6/1999 | Anderson et al. | 118/715 |
| 5,950,693 A | 9/1999 | Noah et al. | |
| 5,993,555 A | 11/1999 | Hamilton | 118/715 |
| 6,001,172 A | 12/1999 | Bhandari et al. | 117/84 |
| 6,009,830 A | 1/2000 | Li et al. | 118/723 R |
| 6,013,155 A | 1/2000 | McMillin et al. | 156/345 |
| 6,015,595 A | 1/2000 | Felts | 427/446 |
| 6,019,060 A | 2/2000 | Lenz | 118/723 R |
| 6,039,074 A | 3/2000 | Raaijmakers et al. | |
| 6,042,687 A | 3/2000 | Singh et al. | 156/345 |
| 6,058,958 A | 5/2000 | Benkowski et al. | |
| 6,090,210 A | 7/2000 | Ballance et al. | |
| 6,119,710 A | 9/2000 | Brown | |
| 6,125,788 A | 10/2000 | Hills et al. | |
| 6,132,515 A | 10/2000 | Gauthier | |
| 6,155,289 A | 12/2000 | Carlsen et al. | |
| 6,192,919 B1 | 2/2001 | Jackson et al. | |
| 6,224,681 B1 | 5/2001 | Sivaramakrishnan et al. | |
| 6,251,792 B1 | 6/2001 | Collins et al. | |
| 6,253,783 B1 | 7/2001 | Carlsen et al. | |
| 6,296,711 B1 | 10/2001 | Loan et al. | |
| 6,302,139 B1 | 10/2001 | Dietz | |
| 6,315,858 B1 | 11/2001 | Shinozuka et al. | |
| 6,333,272 B1 | 12/2001 | McMillin et al. | 438/710 |
| 6,418,954 B1 | 7/2002 | Taylor et al. | |
| 6,457,494 B1 | 10/2002 | Gregg et al. | |
| 6,508,913 B2 | 1/2003 | McMillin et al. | 156/345.29 |
| 6,589,350 B1 | 7/2003 | Swartz | 118/710 |
| 6,632,322 B1 | 10/2003 | Gottscho et al. | |
| 7,169,231 B2 | 1/2007 | Larson et al. | |
| 2001/0047760 A1 | 12/2001 | Moslehi | |
| 2002/0014207 A1 | 2/2002 | Sivaramakrishnan et al. | |
| 2002/0018965 A1 | 2/2002 | Vahedi et al. | |
| 2002/0042205 A1* | 4/2002 | McMillin et al. | 438/710 |
| 2002/0100416 A1 | 8/2002 | Sun et al. | |
| 2002/0108570 A1 | 8/2002 | Lindfors | |
| 2002/0108933 A1 | 8/2002 | Hoffman et al. | |
| 2002/0144657 A1 | 10/2002 | Chiang et al. | |
| 2002/0144706 A1 | 10/2002 | Davis et al. | 134/1.1 |
| 2002/0160125 A1 | 10/2002 | Johnson et al. | |
| 2002/0170598 A1 | 11/2002 | Girard et al. | |
| 2002/0173160 A1 | 11/2002 | Keil et al. | |
| 2002/0192369 A1 | 12/2002 | Morimoto et al. | |
| 2003/0003696 A1 | 1/2003 | Gelatos et al. | |
| 2003/0019580 A1 | 1/2003 | Strang | |
| 2003/0070620 A1 | 4/2003 | Cooperberg et al. | |
| 2003/0094903 A1 | 5/2003 | Tao et al. | |
| 2003/0226641 A1 | 12/2003 | Collins et al. | |
| 2004/0112540 A1 | 6/2004 | Larson et al. | |
| 2004/0129211 A1 | 7/2004 | Blonigan et al. | |

FOREIGN PATENT DOCUMENTS

| | | |
|---|---|---|
| EP | 1077476 | 2/2001 |
| EP | 1 158 565 A2 | 11/2001 |
| EP | 1 300 877 A1 | 4/2003 |
| JP | 403-281780 | 12/1991 |
| JP | 11/016888 A | 1/1999 |
| JP | 2002/280357 | 9/2002 |
| WO | 01/29879 A2 | 4/2001 |
| WO | 02/080251 A1 | 10/2002 |
| WO | WO 02/095519 A1 | 11/2002 |

OTHER PUBLICATIONS

U.S. Office Action mailed Aug. 3, 2004 from U.S. Appl. No. 10/318,612.
U.S. Office Action mailed Jan. 13, 2005 from U.S. Appl. No. 10/318,612.
U.S. Office Action mailed Apr. 27, 2005 from U.S. Appl. No. 10/685,739.
U.S. Office Action mailed Jun. 7, 2005 from U.S. Appl. No. 10/318,612.
U.S. Office Action mailed Sep. 27, 2005 from U.S. Appl. No. 10/642,083.
U.S. Office Action mailed Oct. 14, 2005 from U.S. Appl. No. 10/685,739.
Mirriam-Webster's Collegiate Dictionary—10th Ed. p. 820 ("orifice").
C. Janowiak et al., "Etching of organic low dielectric constant material SiLK™ on the Lam Research Corporation 4520XLE™", J. Vac. Sci. Technol. A 18(4), Jul./Aug. 2000, pp. 1859-1863.
International Search Report, dated Dec. 1, 2005.
U.S. Office Action mailed Nov. 14, 2005 from U.S. Appl. No. 10/318,612.
U.S. Office Action mailed Mar. 9, 2006 from U.S. Appl. No. 10/642,083.
U.S. Office Action mailed Mar. 9, 2006 from U.S. Appl. No. 10/685,739.
U.S. Office Action mailed Apr. 7, 2006 from U.S. Appl. No. 10/318,612.
Office Action Dated Aug. 3, 2004 from U.S. Appl. No. 10/318,612.
Office Action Dated Jan. 13, 2005 from U.S. Appl. No. 10/318,612.
Office Action Dated Jun. 7, 2005 from U.S. Appl. No. 10/318,612.
Notice of Allowance Dated Oct. 5, 2006 from U.S. Appl. No. 10/318,612.
Office Action Dated Jun. 28, 2006 from U.S. Appl. No. 10/642,083.
Office Action Dated Sep. 28, 2006 from U.S. Appl. No. 10/642,083.
Office Action Dated Feb. 23, 2007 from U.S. Appl. No. 10/642,083.
Office Action Dated Oct. 19, 2007 from U.S. Appl. No. 10/642,083.
Office Action Dated Aug. 15, 2006 from U.S. Appl. No. 10/685,739.
Examiner's Answer to Appeal Brief Dated Jun. 1, 2007 from U.S. Appl. No. 10/685,739.
Office Action Dated Jul. 19, 2007 from U.S. Appl. No. 10/685,739.
Supplemental Examiner's Answer to Appeal Brief Dated Dec. 27, 2007 from U.S. Appl. No. 10/685,739.
European Search Report Mailed Dec. 5, 2007.
Notice of Allowance Mailed Jan. 29, 2008 from U.S. Appl. No. 10/642,083.
Australian Written Opinion dated Apr. 1, 2008 from Singapore Patent Application No. 200608751-4.
Australian Search Report dated Apr. 1, 2008 from Singapore Patent Application No. 200608751-4.
Examination Report dated Dec. 18, 2008 from Singapore Patent Application No. 200608751-4.

* cited by examiner

METHOD FOR PROVIDING UNIFORM REMOVAL OF ORGANIC MATERIAL

RELATED APPLICATIONS

This application is a continuation-in-part of U.S. patent application Ser. No. 10/642,083 entitled "Uniform Etch System," by Larsen et al. filed Aug. 14, 2003 now U.S. Pat. No. 7,371,332, which is a continuation-in-part of U.S. patent application Ser. No. 10/318,612 entitled "Gas Distribution System With Tuning Gas," by Larsen et al. filed Dec. 13, 2002 now U.S. Pat. No. 7,169,231, which are both hereby incorporated by reference.

BACKGROUND OF THE INVENTION

Semiconductor processing includes deposition processes such as chemical vapor deposition (CVD) of metal, dielectric and semiconducting materials, etching of such layers, ashing of photoresist masking layers, etc. Such semiconductor processes are typically carried out in vacuum chambers wherein process gas is used to treat a substrate such as a semiconductor wafer, flat panel display substrate, etc. The process gas can be supplied to the interior of the vacuum chamber by a gas distribution system such as a showerhead, a gas distribution ring, gas injectors, etc. Reactors having plural gas distribution systems are disclosed in U.S. Pat. Nos. 5,134,965; 5,415,728; 5,522,934; 5,614,055; 5,772,771; 6,013,155; and 6,042,687.

In the case of etching, plasma etching is conventionally used to etch metal, dielectric and semiconducting materials. A plasma etch reactor typically includes a pedestal supporting the silicon wafer on a bottom electrode, an energy source which energizes process gas into a plasma state, and a process gas source supplying process gas to the chamber.

A common requirement in integrated circuit fabrication is the etching of openings such as contacts and vias in dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc. A plasma etching technique, wherein a parallel plate plasma reactor is used for etching openings in silicon oxide, is disclosed in U.S. Pat. No. 5,013,398.

U.S. Pat. No. 5,736,457 describes single and dual "damascene" metallization processes. In the "single damascene" approach, vias and conductors are formed in separate steps wherein a metallization pattern for either conductors or vias is etched into a dielectric layer, a metal layer is filled into the etched grooves or via holes in the dielectric layer, and the excess metal is removed by chemical mechanical planarization (CMP) or by an etch back process. In the "dual damascene" approach, the metallization patterns for the vias and conductors are etched in a dielectric layer and the etched grooves and via openings are filled with metal in a single metal filling and excess metal removal process.

Various methods in semiconductor processing, such as damascene metallization processes, require methods for removing organic material over substrates, such as stripping a photoresist mask, etching an organic bottom antireflective coating (BARC), removing a via plug, or etching an organic dielectric layer.

SUMMARY OF THE INVENTION

To achieve the foregoing and in accordance with the purpose of the present invention a method for removing organic material over a substrate is provided. The substrate is placed in a plasma processing chamber. A first gas is provided to an inner zone within the plasma processing chamber. A second gas is provided to an outer zone of the plasma processing chamber, wherein the outer zone surrounds the inner zone and the second gas has a carbon containing component, wherein a concentration of the carbon containing component of the second gas is greater than a concentration of the carbon containing component in the first gas. Plasmas are simultaneously generated from the first gas and second gas. Some of the organic material is removed using the generated plasmas.

In another manifestation of the invention a method for stripping a photoresist mask over a substrate is provided. The substrate is placed in a plasma processing chamber. A first gas is provided to an inner zone within the plasma processing chamber. A second gas is provided to the outer zone of the plasma processing chamber, wherein the outer zone surrounds the inner zone and the first gas is different than the second gas. Plasmas are simultaneously generated from the first gas and second gas. The photoresist mask is stripped, wherein the photoresist mask is stripped by the plasmas from the first gas and second gas.

In another manifestation of the invention a method for removing plugs in a via of a dual damascene structure over a substrate is provided. The substrate with a dielectric layers with vias with via plugs is placed in a plasma processing chamber. A first gas is provided to an inner zone within the plasma processing chamber. A second gas is provided to the outer zone of the plasma processing chamber, wherein the outer zone surrounds the inner zone and the first gas is different than the second gas. Plasmas are simultaneously generated from the first gas and second gas. The vias plugs are removed by the plasmas from the first gas and the second gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

Figure 2:
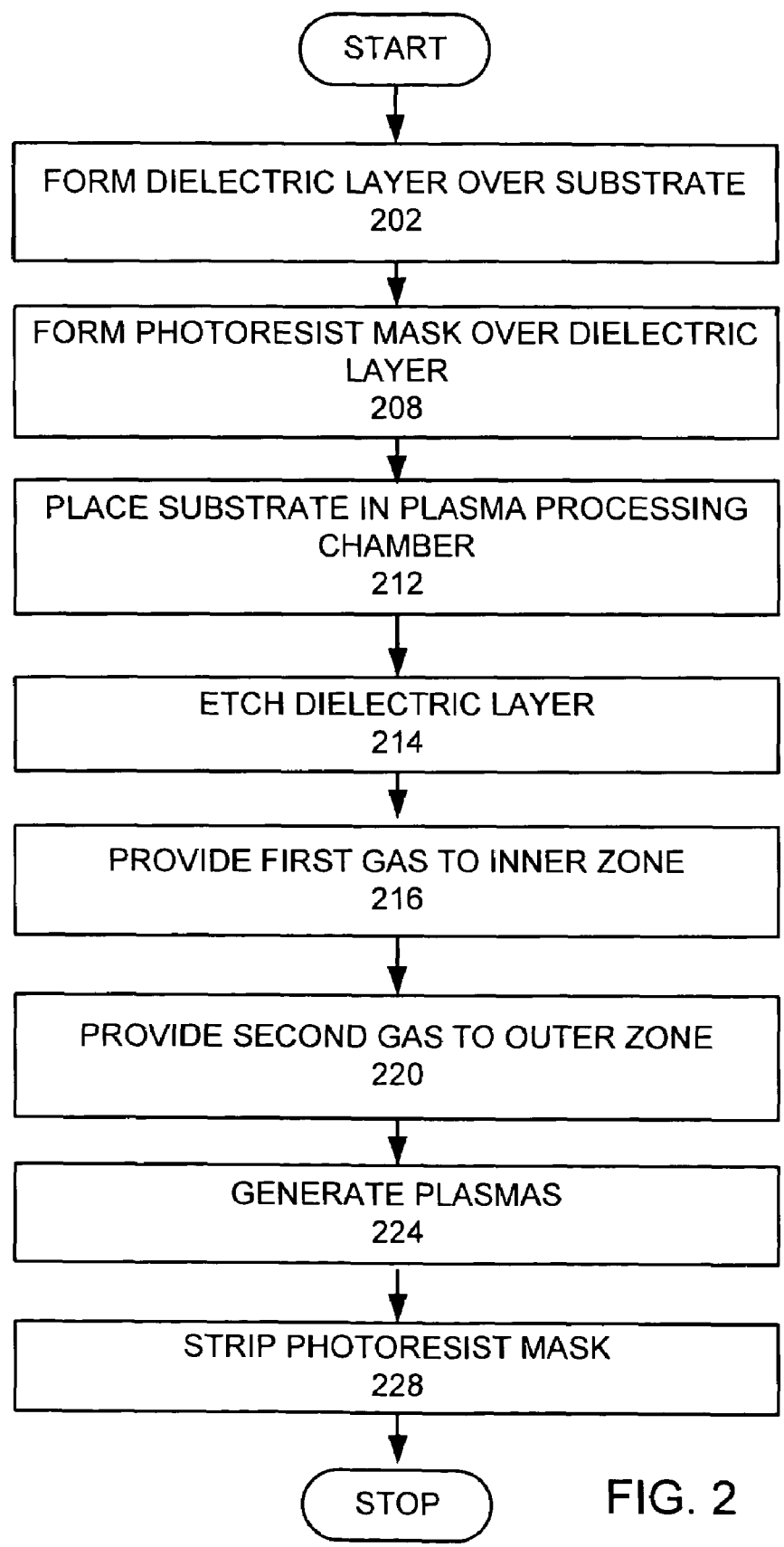
FIG. 2 is a flow chart of an embodiment of the invention for stripping.

FIG'S. 3A-C are cross-sectional views of a substrate in the processed according to the process shown in FIG. 2.

FIG'S. 4A-B are schematic illustrations of a computer system that may be used as a controller.

Figure 5:
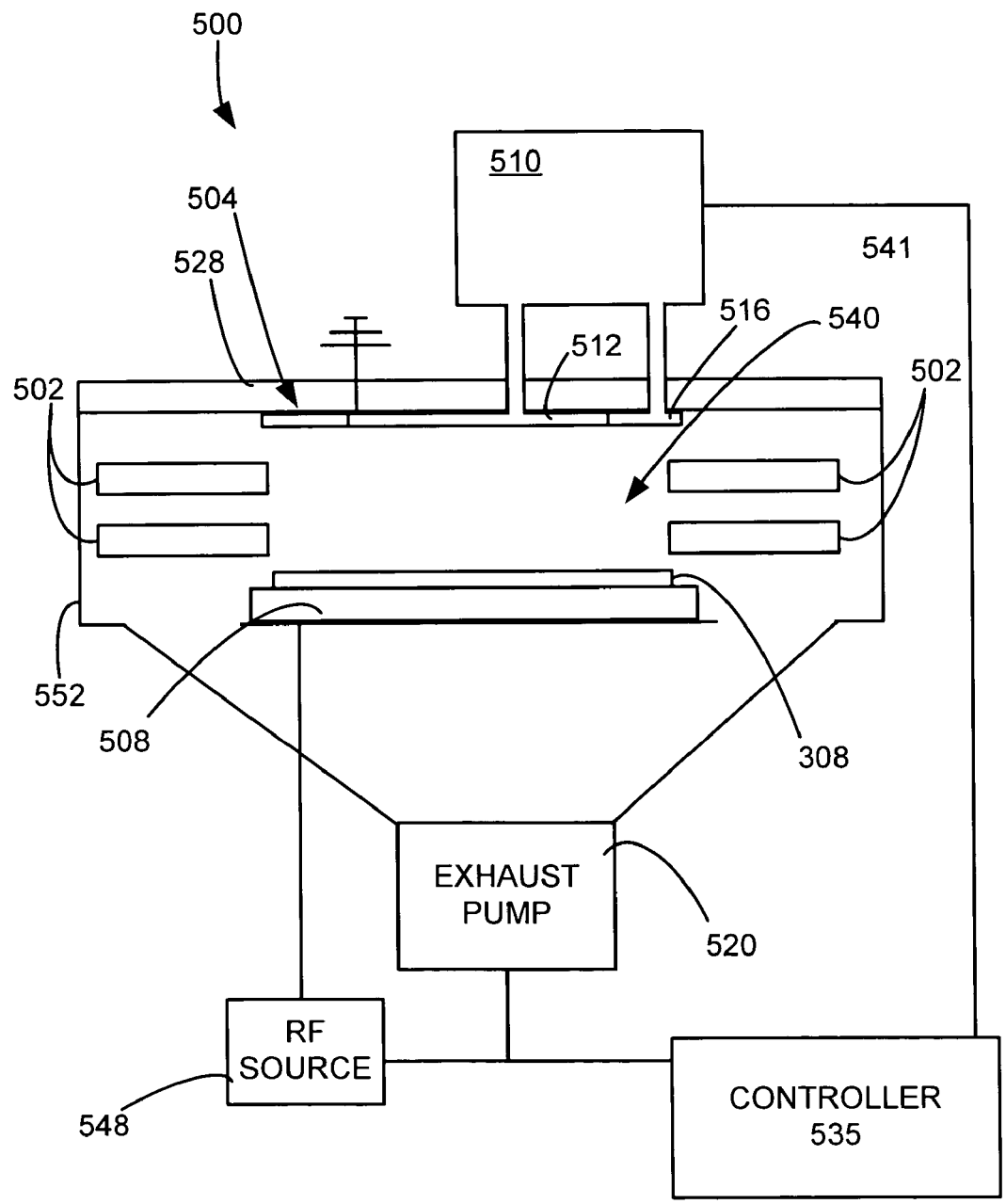

FIG. 5 is a schematic view of such a process chamber that may be used in practicing the invention.

Figure 6:
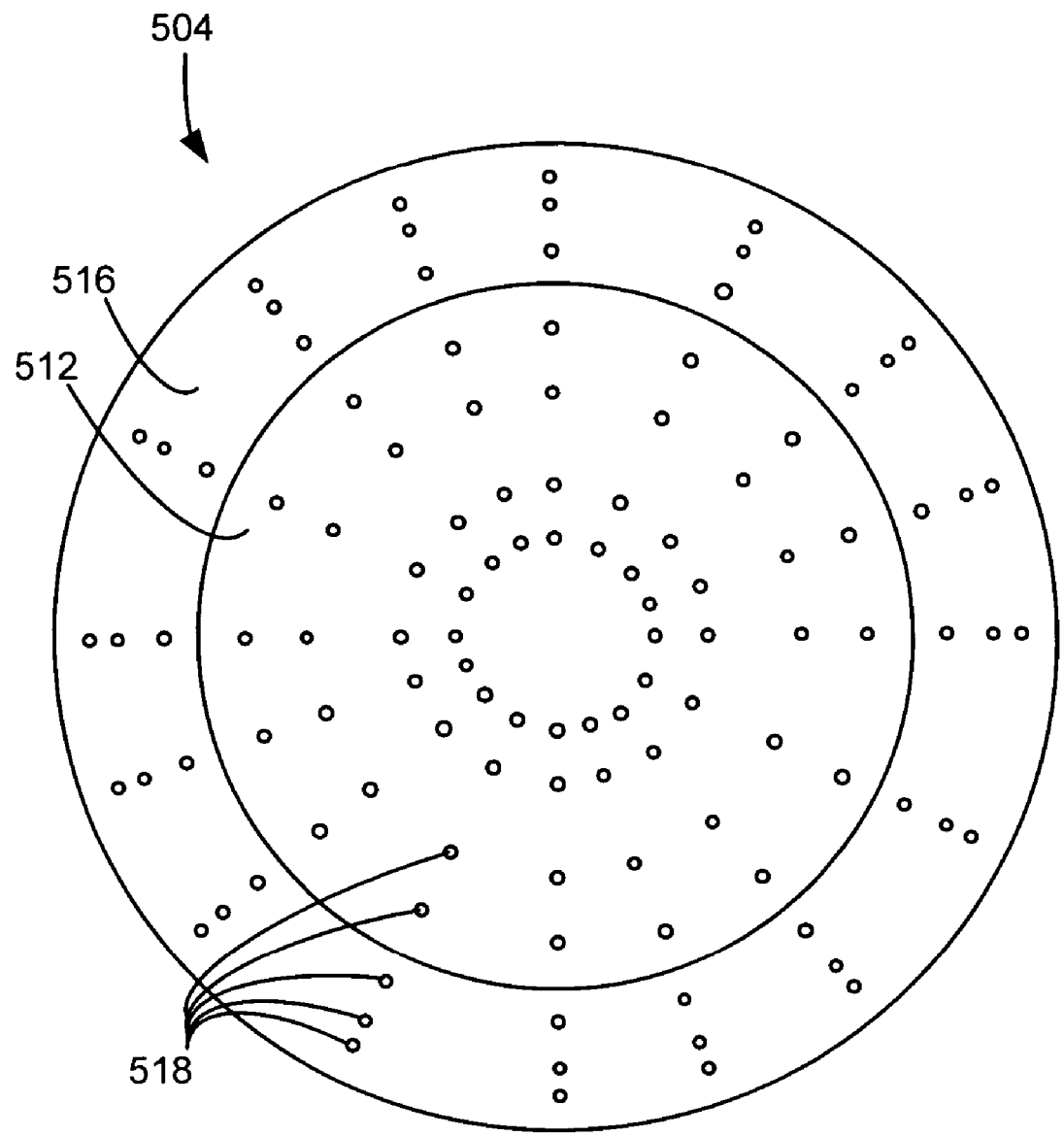

FIG. 6 is a schematic bottom view of a gas distribution plate.

Figure 7:
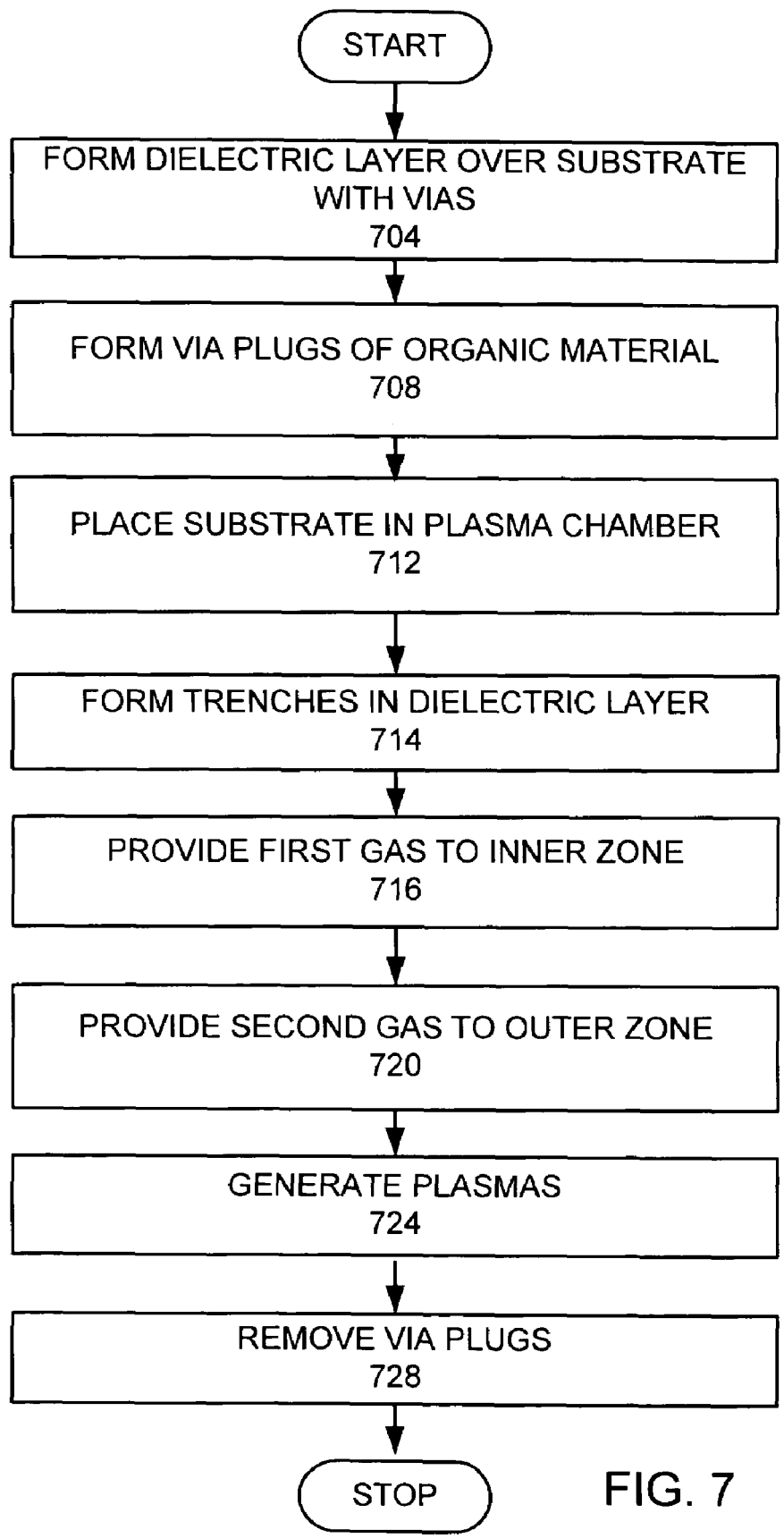

FIG. 7 is a flow chart of an embodiment of the invention for removing via plugs.

Figure 8:
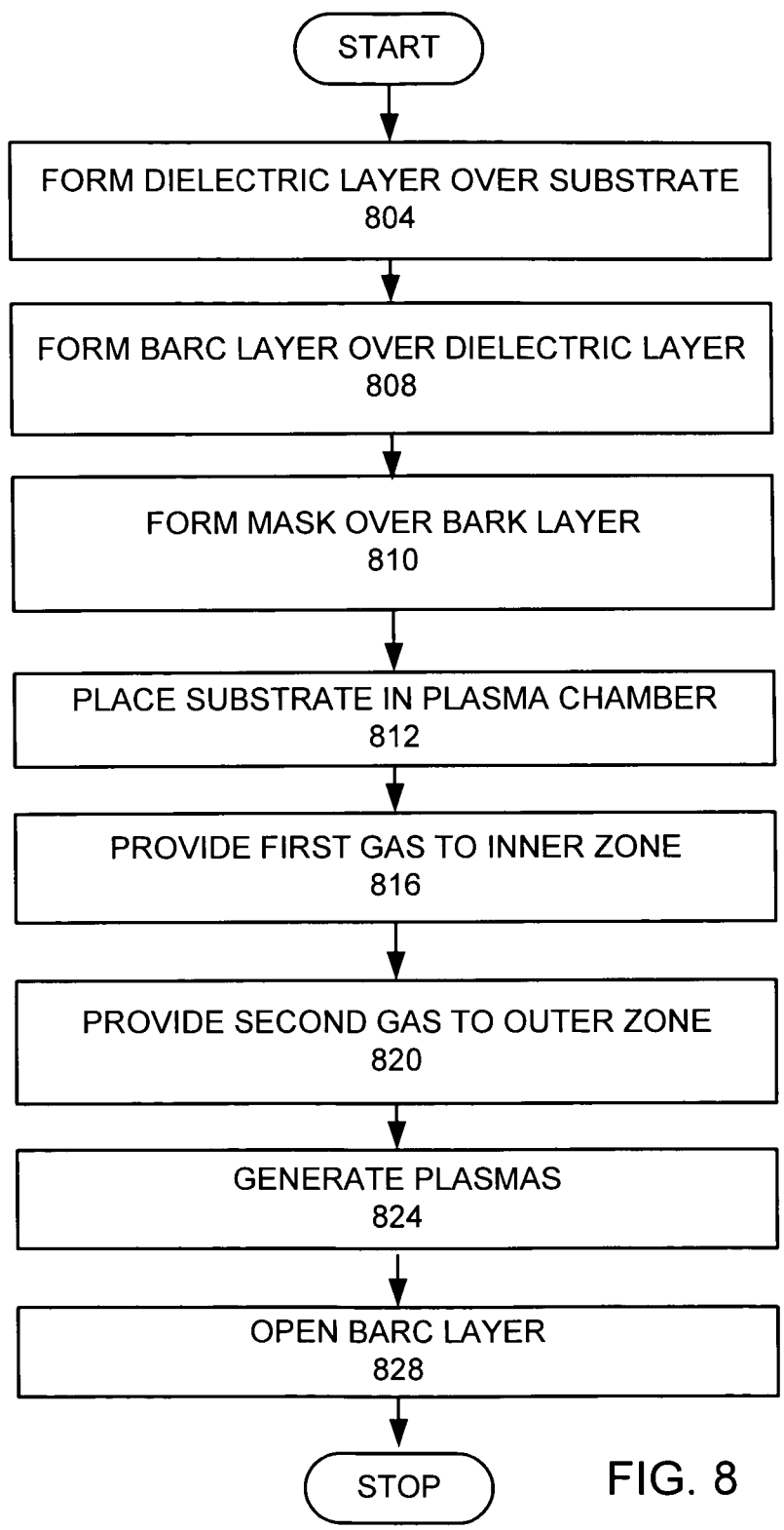

FIG. 8 is a flow chart of an embodiment of the invention for opening a BARC layer.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
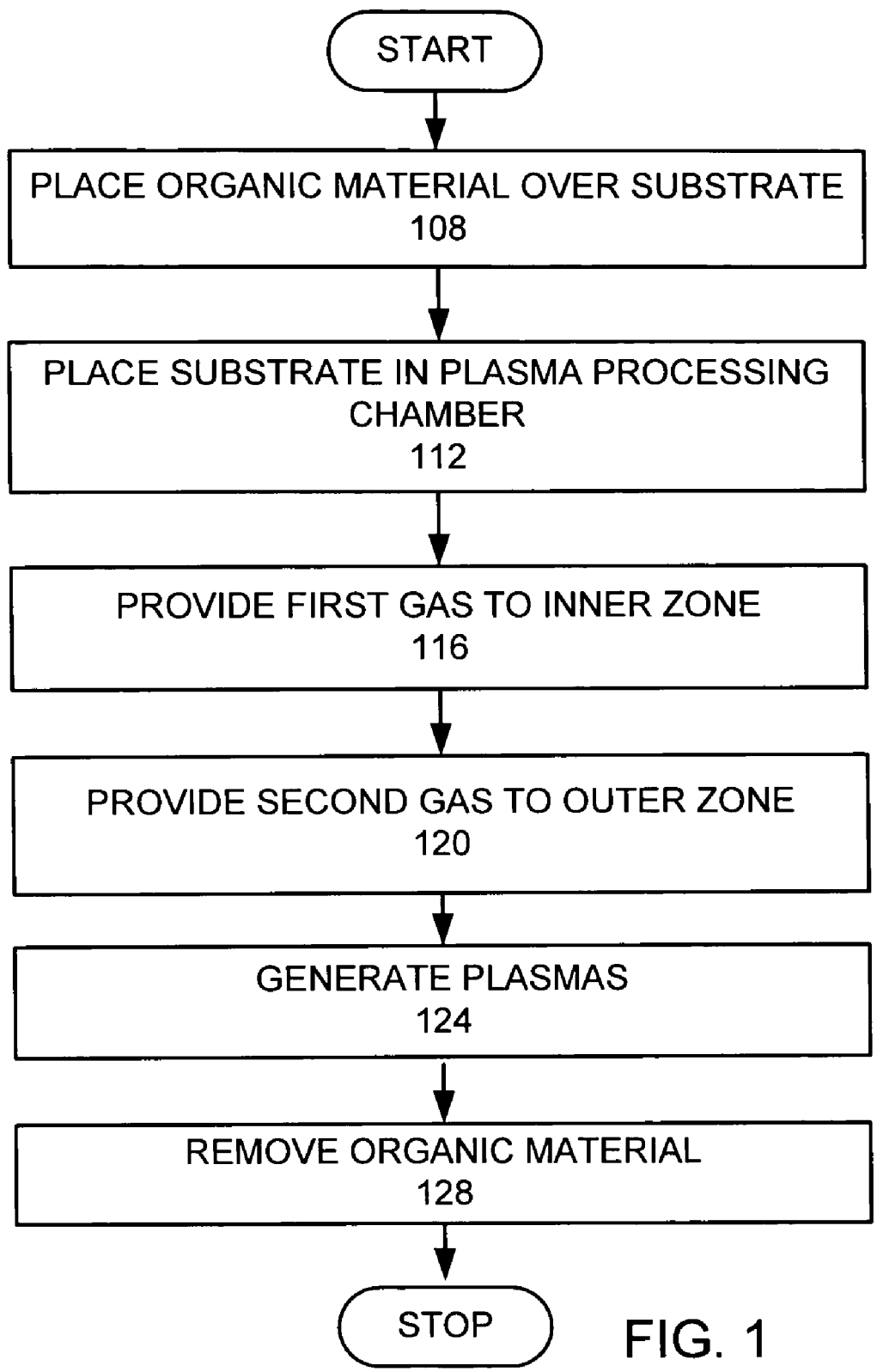
FIG. 1 is a flow chart of an embodiment of the invention.

To facilitate understanding, FIG. 1 is a high level flow chart of an embodiment of the invention. Organic material is place over a substrate (step 108). The organic material may be photoresist, BARC, a via plug, or an organic dielectric layer. In the case of photoresist, BARC, or a via plug, a dielectric layer is between the substrate and the organic material. The substrate is placed in a plasma processing chamber (step 112). A first gas is provided to an inner zone of the plasma processing chamber (step 116). A second gas is provided to an outer zone of the plasma processing chamber (step 120). The outer zone surrounds the inner zone. The second gas has a carbon containing component. The concentration of the carbon containing component of the second gas is greater than the concentration of the carbon containing component of the first gas. Plasmas are simultaneously generated from the first and second gas, by forming a plasma from the first gas and a plasma from the second gas (step 124). The plasmas remove some of the organic material (step 128). Although the providing the first gas (step 116) and the providing the second step (step 120) are shown sequentially, these steps may be done in opposite order or may be done simultaneously.

In the specification and claims, a first gas is defined as a gas with a single component or with a plurality of components to form a gas mixture. A first gas is different than a second gas, only if the first gas and second gas have different components or the same components in different ratios. Different flow rates of gases with the same components at the same ratios are not different gases.

In a preferred embodiment of the invention, the plasma processing chamber uses a confined plasma system, which confines the plasma to a region above the wafer. Such a confined plasma system may use confinement rings, as disclosed in U.S. Pat. No. 6,019,060, by Eric Lenz, entitled "CAM-BASED ARRANGEMENT FOR POSITIONING CONFINEMENT RINGS IN A PLASMA PROCESSING CHAMBER", issued Feb. 1, 2000, which is incorporated by reference for all purposes. Such a plasma confinement system is used in the 2300 Exelan chamber, made by Lam Research Corporation of Fremont, Calif.

Without being bound by theory, it is believed that in the removal of organic material from over a substrate, a loading effect at the edge of the substrate may be due to the lack of consumable organic material at the outer diameter of the substrate compared to the center of the substrate, which causes a non-uniform removal of organic material, where the organic material closer to the edge of the substrate is removed faster. As a result uneven etching or damage to a layer below the organic material may result. Providing a higher concentration of carbon containing component at the edge of the substrate has been found to provide a more uniform removal of the organic material.

Some of the carbon containing components that may be used in the invention are $CH_4$, $C_2H_4$, $CO$, $CH_3F$, $CH_2F_2$, and $CF_4$. For some applications, it is preferable to use a fluorine free carbon containing component.

Some of the gases that are useful in removing the organic components are $O_2$, $O_2/N_2$, $O_2/CO$, $O_2$, $NH_3$, $N_2/H_2$, $N_2O$, and $H_2O$.

Stripping

Figure 3A:
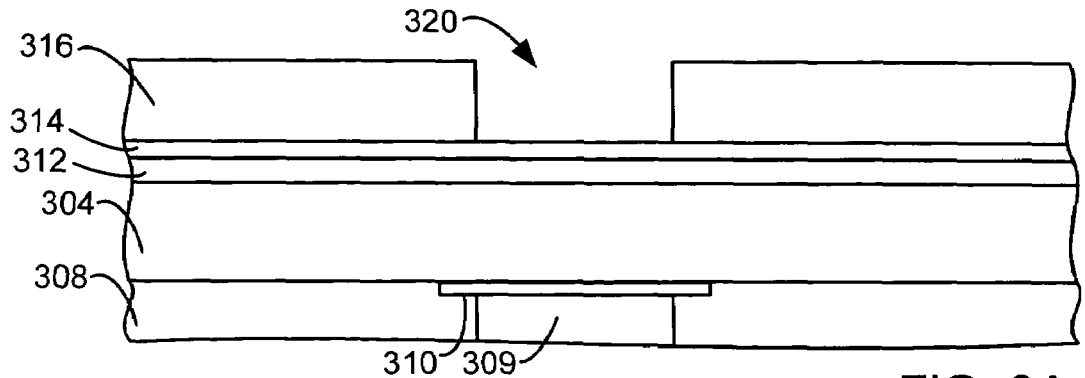

One example of the inventive process provides a uniform stripping of a photoresist mask. FIG. 2 is a flow chart of a process that is used in this example. In this example, a low-k dielectric layer, which is preferably organosilicate glass, is formed over a substrate. FIG'S. 3A-C are schematic side views of a low-k dielectric layer (k<3.0), according to the process of FIG. 2. A low-k dielectric layer 304 may be deposited over a substrate 308 (step 204), as shown in FIG. 3A. The substrate 308 may be a silicon wafer or another type of material or may be part of a layer over a wafer. A cap layer 312 is formed over the low-k dielectric layer 304. The cap layer 312 may be silicon oxide. Generally, the cap layer is a protective layer of a dielectric material. The cap layer 312 protects the low-k dielectric layer 304 during chemical mechanical polishing (CMP) and other processes. The cap layer 312 may be a low-k dielectric, since the cap layer is part of the end product. Preferably, the cap layer may be of a silicon oxide base material. An antireflective coating (ARC) 314 is deposited over the cap layer 312. The antireflective coating (ARC) 314 may be an organic bottom antireflective coating (BARC) or an inorganic dielectric antireflective coating (DARC). A patterned photoresist mask 316 is provided over the ARC 314 (step 208). The patterned resist mask 316 has an aperture 320. The patterned resist mask may be formed by placing a layer of photoresist, which is exposed to a light pattern and then etched. Other methods of forming a patterned resist mask may be used. The substrate 308 may have a contact 309 and a barrier layer 310.

The substrate 308 is placed in a processing chamber where the low-k dielectric layer 304 is etched (step 212).

In this example of the implementation of the invention, an 2300 Exelan chamber, made by Lam Research Corporation of Fremont, Calif. is used as the etch process chamber for a 200 mm wafer, using a dual gas distribution system with a tuning gas as described above. FIG. 5 is a schematic view of such a system 500. In this example, the plasma processing chamber 500 comprises confinement rings 502, a gas distribution plate 504, a lower electrode 508, a gas source 510, and an exhaust pump 520. Within plasma processing chamber 500, the substrate wafer 308, on which the dielectric layer is deposited, is positioned upon the lower electrode 508. The lower electrode 508 incorporates a suitable substrate chucking mechanism (e.g., electrostatic, mechanical clamping, or the like) for holding the substrate wafer 308. The reactor top 528 incorporates the gas distribution plate 504 disposed immediately opposite the lower electrode 508. The gas distribution plate forms an upper electrode, which is grounded. The gas distribution plate 504, lower electrode 508, and confinement rings 502 define the confined plasma volume 540.

FIG. 6 is a schematic bottom view of the gas distribution plate 504. The gas distribution plate comprises an inner zone plate 512 and an outer zone plate 516. A plurality of ports 518 is formed in the inner zone plate 512 and the outer zone plate 516. The ports 518 may be placed in various configurations, where the shown configuration is provided to mainly to illustrate that each zone plate has a plurality of ports 518. Both the inner zone plate 512 and the outer zone plate 516 are spaced apart from and opposite from the wafer 580 on the lower electrode 508. The gas source 510 may be any gas source that provides different gases to the inner zone plate 516 and the outer zone plate 518.

Gas is supplied to the confined plasma volume by gas source 510 through the ports 518 of the inner zone plate 512 and the outer zone plate 516, and is exhausted from the confined plasma volume through the confinement rings 502 and an exhaust port by the exhaust pump 520. The exhaust pump 520 forms a gas outlet for the plasma processing chamber. A RF source 548 is electrically connected to the lower electrode 508. Chamber walls 552 define a plasma enclosure in which the confinement rings 502, the gas distribution plate 504, and the lower electrode 508 are disposed. The RF source 548 may comprise a high frequency power source operating at 27 MHz and a low frequency power source operating at 2 MHz. The gas distribution plate 504 may be grounded. Different combinations of connecting RF power to the electrodes are possible. A controller 535 is controllably connected to the RF source 548, the exhaust pump 520, and the gas source 510.

Figure 4A:
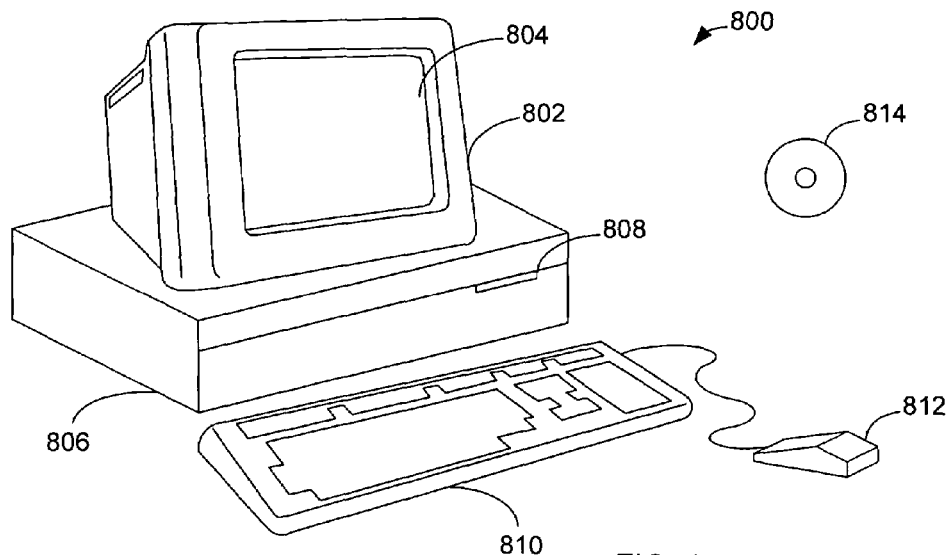

FIG'S. 4A and 4B illustrate a computer system 800, which is suitable for using as the controller 535. FIG. 4A shows one possible physical form of a computer system that may be used for the controller 340. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

Figure 4B:
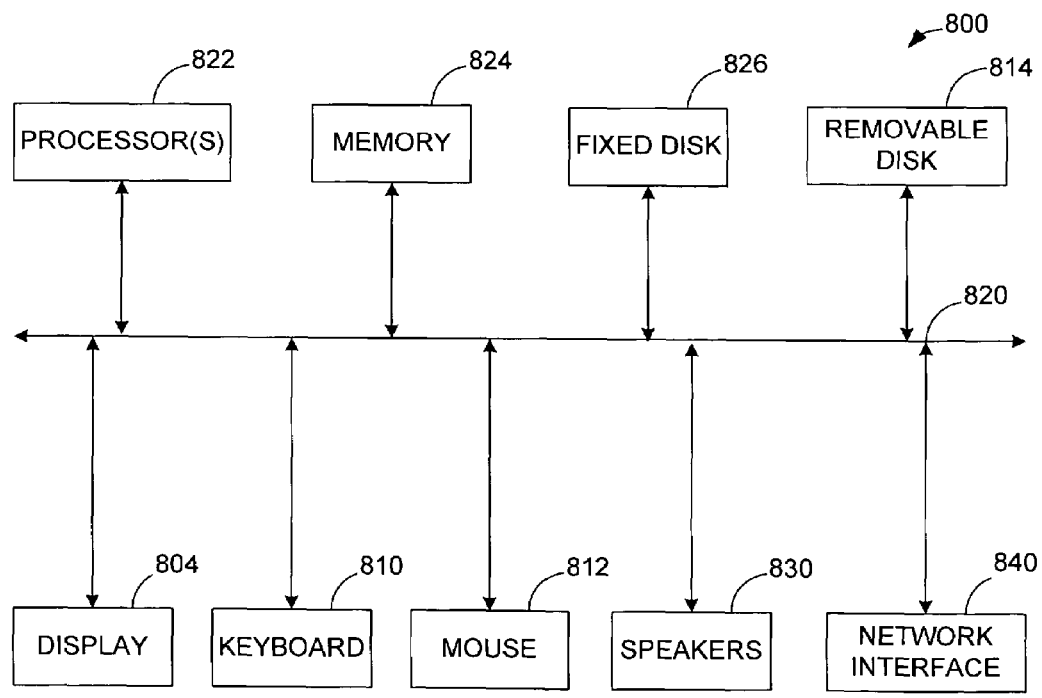

FIG. 4B is an example of a block diagram for computer system 800. Attached to system bus 820 is a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of any of the computer-readable media described below.

CPU 822 is also coupled to a variety of input/output devices, such as display 804, keyboard 810, mouse 812 and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3B:
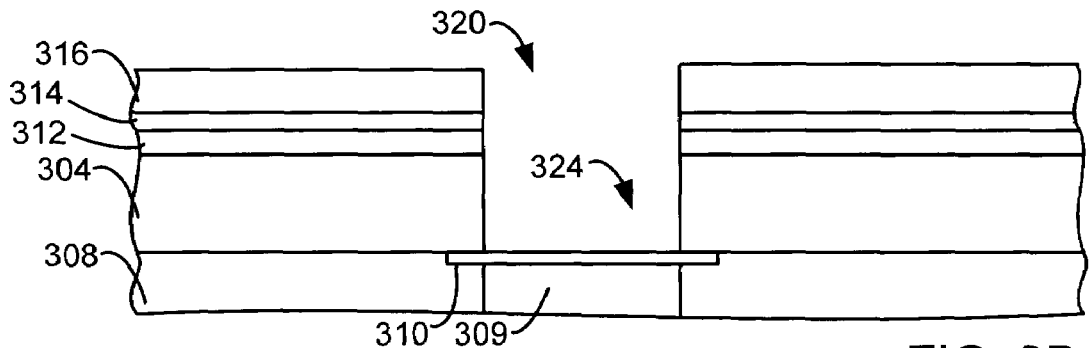
Figure 3C:
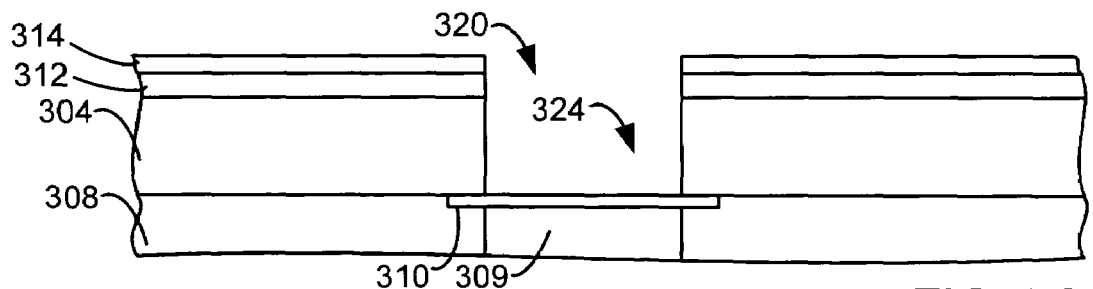

A plasma dry etch may be used to etch the low-k dielectric layer 304, which forms an opening 324 under the aperture 320 in the patterned resist mask 316, as shown in FIG. 3B. Some of the patterned resist mask 316 is removed during the low-k dielectric layer etch. Such low-k dielectric etches may use a chemical etch, such as using a fluorine based etchant.

A uniform stripping process is then provided to remove the photoresist mask 316 without damaging the low-k dielectric layer. To provide the uniform stripping process, a first gas is provided to the inner zone 512 (step 216). In this example, the first gas is pure $O_2$. A second gas is provided to the outer zone 516 (step 220). In this example, the second gas is a mixture of $O_2$ for stripping and $C_2H_4$ as the carbon containing gas. Plasmas are generated from the first and second gases (step 224). The plasmas are used to provide a uniform photoresist strip (step 228).

Therefore, in this example none of the carbon containing gas is provided directly to the inner zone. In one implementation of this, a dual gas feed divides the flow of $O_2$ between the inner zone and outer zone. A tuning gas of $C_2H_4$ is then added only to the outer zone. In an example of a recipe, the chamber pressure is set at 20 mTorr. The lower electrode provides 600 Watts at 27 MHz and 0 Watts at 2 MHz. 300 sccm of $O_2$ is provided to the chamber, with the addition of a $C_2H_4$ tuning gas to only the outer zone. This is maintained for 60 seconds.

A preferred stripping process would have a chamber pressure between 0 and 1,000 mTorr, with a lower frequency (ie. 2 MHz) power of between 0-1,000 Watts, a higher frequency (i.e. 27 MHz) power between 50-1,000 Watts, an $O_2$ flow between 20-2,000 sccm, and a $C_2H_4$ addition to the outer region only of between 10-2,000sccm.

A more preferred stripping process would have a chamber pressure between 1 and 500 mTorr, with a lower frequency (ie. 2 MHz) power of between 0-500 Watts, a higher frequency (i.e. 27 MHz) power between 100-900 Watts, an $O_2$ flow between 100-1,000 sccm, and a $C_2H_4$ addition to the outer region only of between 20-1,000sccm.

In another embodiment, the first gas is pure $O_2$ and the second gas is pure $C_2H_4$. There is sufficient loading so that enough $O_2$ migrates from the inner zone to the outer zone to uniformly strip the photoresist.

In some etching processes etch residue may redeposited. It may be desirable to provide small amounts of fluorine to help remove the etch residue. In such a case, the carbon containing component may be $CH_3F$. In a preferred embodiment, the $CH_3F$ is only provided to the outer zone. Although fluorine from $CH_3F$ is only directly provided to the outer zone, sufficient fluorine will migrate from the outer zone to the inner zone to reduce masking.

Etch Back

Another example of the inventive process provides a uniform via plug removal process. FIG. 7 is a flow chart of a process that is used in this example. A dielectric layer is be deposited over a substrate and vias are formed in the dielectric layer (step 704). The substrate may be a silicon wafer or another type of material or may be part of a layer over a wafer. Via plugs of an organic material are formed in the vias (step 708). A trench pattern photoresist mask is then placed over the dielectric layer.

The substrate may be placed in a processing chamber where the dielectric layer is etched (step 712). The plasma process chamber described above or other plasma process chambers may be used. A plasma dry etch is used to etch the dielectric layer to form trenches. The via plugs are used to reduce faceting during the trench etch. Fence formations may be formed during the trench etch around the via top. Some of the patterned resist mask is removed during the trench etch.

An etch back process is used to reduce the via plug height. By having the correct via height fence formations, and faceting of the vias is reduced or eliminated during the trench etch. Therefore the reduction of the via plug height is done after via etch and organic BARC fill but before trench patterning. To provide etch back process, a first gas is provided to the inner zone (step 716). In this example, the first gas is pure $O_2$. A second gas is provided to the outer zone (step 720). In this example, the second gas is pure $C_2H_4$. Plasmas are generated from the first and second gases (step 724). The plasmas are used to remove the via plugs (step 728). This process may be used to also strip the remaining photoresist.

This process provides a uniform plug removal, which provides the advantage of consistently fence and facet free vias in the dual damascene structures.

Therefore, in this example none of the carbon containing gas is provided directly to the inner zone. In one implementation of this, a dual gas feed divides the flow of $O_2$ between the inner zone and outer zone. A tuning gas of $C_2H_4$ is then added only to the outer zone. In an example of a recipe, the chamber pressure is set at 400mTorr. The lower electrode provides 0 Watts at 27 MHz and 600 Watts at 2 MHz. 300 sccm of $O_2$ is provided to the chamber, with the addition of a $C_2H_4$ tuning gas to only the outer zone. This is maintained for 60 seconds.

A preferred uniform plug removal process would have a chamber pressure between 0 and 1,000 mTorr, with a lower frequency (ie. 2 MHz) power of between 50-1,000 Watts, a higher frequency (i.e. 27 MHz) power between 0-1,000Watts, an $O_2$ flow between 20-2,000 sccm, and a $C_2H_4$ addition to the outer region only of between 10-2,000 sccm.

A more preferred uniform plug remvoal process would have a chamber pressure between 1 and 500 mTorr, with a lower frequency (ie. 2 MHz) power of between 0-500 Watts, a higher frequency (i.e. 27 MHz) power between 100-900Watts, an $O_2$ flow between 100-1,000 sccm, and a $C_2H_4$ addition to the outer region only of between 20-1,000 sccm.

BARC Open

Another example of the inventive process provides a uniform BARC open process. FIG. 8 is a flow chart of a process that is used in this example. In this example, a dielectric layer is formed over a substrate. A dielectric layer is be deposited over a substrate (step 804). The substrate may be a silicon wafer or another type of material or may be part of a layer over a wafer. A BARC layer is formed over the dielectric layer (step 808). A patterned mask is then placed over the BARC layer (step 810).

The substrate is placed in a processing chamber (step 812). The plasma process chamber described above or other plasma process chambers may be used. A uniform BARC open process is then provided to open the BARC layer. To provide the uniform BARC open process, a first gas is provided to the inner zone (step 816). In this example, the first gas is $N_2/H_2$. A second gas is provided to the outer zone (step 820). In this example, the second gas is pure $C_2H_4$. Plasmas are generated from the first and second gases (step 824). The plasmas are used to uniformly open the BARC layer (step 828).

Therefore, in this example none of the carbon containing gas is provided directly to the inner zone. In one implementation of this, a dual gas feed divides the flow of $O_2$ between the inner zone and outer zone. A tuning gas of $C_2H_4$ is then added only to the outer zone. In an example of a recipe, the chamber pressure is set at 60mTorr. The lower electrode provides 600 Watts at 27 MHz and 0 Watts at 2 MHz. 300 sccm of $O_2$ is provided to the chamber, with the addition of a $C_2H_4$ tuning gas to only the outer zone. This is maintained for 60 seconds.

A preferred BARC open process would have a chamber pressure between 0 and 1,000 mTorr, with a lower frequency (ie. 2 MHz) power of between 0-1,000Watts, a higher frequency (i.e. 27 MHz) power between 50-1,000 Watts, an $O_2$ flow between 20-2,000 sccm, and a $C_2H_4$ addition to the outer region only of between 10-2,000sccm.

A more preferred BARC open process would have a chamber pressure between 1 and 500 mTorr, with a lower frequency (ie. 2 MHz) power of between 0-500Watts, a higher frequency (i.e. 27 MHz) power between 100-900 Watts, an $O_2$ flow between 100-1,000 sccm, and a $C_2H_4$ addition to the outer region only of between 20-1,000 sccm.

Other examples may use the inventive process to uniformly etch a SiLK layer by providing a higher concentration of carbon containing component on the outer zone. This results in improved uniformity for trench and improved uniformity allows for less over etch in the case of vias.

Other components may be found in alternative to a carbon containing component that reduces loading to slow down the etching of the outer part of the wafer to provide a more uniform etch.

Other gas distribution embodiments may be used in other embodiments to provide a first gas to an inner zone and a second gas to an outer zone surrounding the inner zone where the first gas is different than the second gas. For example alternating ports in the outer zone area may provide different component gases, which together make up the second gas provided to the outer zone and/or alternating ports in the inner zone area may provide different component gases, which together make up the first gas, so that the first gas is different than the second gas. However, it is preferable that the component gases of the first gas be combined in the gas distribution system before the first gas is provided into the chamber and that the component gases of the second gas be combined in the gas distribution system before the second gas is provided into the chamber.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for removing organic material over a substrate, comprising:
   placing the substrate in a plasma processing chamber;
   providing a first gas to an inner zone within the plasma processing chamber, wherein the first gas is provided to the inner zone via a first set of holes in a top plate of the plasma processing chamber, wherein the top plate is located above the substrate, wherein the inner zone comprises an organic material removing gas, wherein the first gas has no carbon containing component;
   providing a second gas to an outer zone of the plasma processing chamber, wherein the outer zone surrounds the inner zone and the second gas has a carbon containing component, wherein a concentration of the carbon containing component of the second gas is greater than a concentration of the carbon containing component in the first gas, and wherein the second gas is provided to the outer zone via a second set of holes in the top plate;
   simultaneously generating plasmas from the first gas and second gas;
   removing some of the organic material using the generated plasmas.

2. The method, as recited in claim 1, wherein the outer zone is adjacent to an edge of the wafer and the inner zone is adjacent to an interior of the wafer surrounded by the edge of the wafer adjacent to the outer zone.

3. The method, as recited in claim 1, wherein the carbon containing component is at least one of $CH_4$, $C_2H_4$, CO, $CH_3F$, $CH_2F_2$, and $CF_4$.

4. The method, as recited in claim 3, wherein the portions of the first and/or second gas not being the carbon containing component are an organic material removing gas including at least one of $O_2$, $O_2/N_2$, $O_2/CO$, $O_2$, $NH_3$, $N_2/H_2$, $N_2O$, and $H_2O$.

5. The method, as recited in claim 1, wherein a dielectric layer is between the organic material and the substrate, wherein the removing some of the organic material removes some of the organic material above the dielectric layer.

6. The method, as recited in claim 5, wherein the dielectric layer is of a low-k dielectric.

7. The method, as recited in claim 5, wherein the organic material is a BARC layer, wherein a photoresist mask is over the BARC layer, wherein the removing some of the organic material opens the BARC layer.

8. The method, as recited in claim 5, wherein the organic material forms a photoresist mask and the removing some of the organic material strips the photoresist mask 9. The method, as recited in claim 8, wherein the dielectric layer is a organosilicate glass layer.

10. The method, as recited in claim 5, wherein the dielectric layer has a plurality of vias and the organic material forms via plugs, and further comprising etching a plurality of trenches in the dielectric layer after the placing the substrate in the processing chamber, wherein the removing some of the organic material reduces heights of organic plugs in the vias.

11. The method, as recited in claim 10, wherein the etching the plurality of trenches creates fence formations, wherein the removing some of the organic material further removes the fence formations.

12. A method for stripping a photoresist mask over a substrate, comprising:
    placing the substrate in a plasma processing chamber;
    providing a first gas to an inner zone within the plasma processing chamber, wherein the first gas is provided to the inner zone via a first set of holes in a top plate of the plasma processing chamber, wherein the top plate is located above the substrate, wherein the inner zone comprises an organic material removing gas, wherein the first gas has no carbon containing component;
    providing a second gas to the outer zone of the plasma processing chamber, wherein the outer zone surrounds the inner zone and the first gas is different than the second gas, and wherein the second gas is provided to the outer zone via a second set of holes in the top plate;
    simultaneously generating plasmas from the first gas and second gas;
    stripping the photoresist mask, wherein the photoresist mask is stripped by the plasmas from the first gas and second gas.

13. A method for removing plugs in vias of a dual damascene structure over a substrate, comprising:
    placing the substrate with a dielectric layer with vias with via plugs in a plasma processing chamber;
    providing a first gas to an inner zone within the plasma processing chamber, wherein the first gas is provided to the inner zone via a first set of holes in a top plate of the plasma processing chamber, wherein the top plate is located above the substrate, wherein the inner zone comprises an organic material removing gas, wherein the first gas has no carbon containing component;
    providing a second gas to an outer zone of the plasma processing chamber, wherein the outer zone surrounds the inner zone and the first gas is different than the second gas, and wherein the second gas is provided to the outer zone via a second set of holes in the top plate;
    simultaneously generating plasmas from the first gas and second gas;
    reducing heights of the vias plugs by the plasmas from the first gas and the second gas.

* * * * *